(12) United States Patent
Kozicki

(10) Patent No.: US 7,180,104 B2
(45) Date of Patent: Feb. 20, 2007

(54) MICROMECHANICAL STRUCTURE, DEVICE INCLUDING THE STRUCTURE, AND METHODS OF FORMING AND USING SAME

(75) Inventor: Michael N. Kozicki, Phoenix, AZ (US)

(73) Assignee: Axon Technologies Corporation, Scottsdale, AZ (US)

( * ) Notice: Subject to any disclaimer, the term of this patent is extended or adjusted under 35 U.S.C. 154(b) by 88 days.

(21) Appl. No.: 10/934,840

(22) Filed: Sep. 3, 2004

(65) Prior Publication Data

US 2005/0045920 A1  Mar. 3, 2005

Related U.S. Application Data

(60) Provisional application No. 60/500,136, filed on Sep. 3, 2003.

(51) Int. Cl.
*H01L 21/8238* (2006.01)

(52) U.S. Cl. .................. 257/213; 257/215; 257/415
(58) Field of Classification Search ............... 257/213, 257/415, 420, 215
See application file for complete search history.

(56) References Cited

U.S. PATENT DOCUMENTS

| | | | | |
|---|---|---|---|---|
| 5,761,115 A | * | 6/1998 | Kozicki et al. | 365/182 |
| 6,635,914 B2 | * | 10/2003 | Kozicki et al. | 257/296 |
| 6,900,498 B2 | * | 5/2005 | Stauf et al. | 257/310 |

* cited by examiner

*Primary Examiner*—Andy Huynh
*Assistant Examiner*—Thinh T Nguyen
(74) *Attorney, Agent, or Firm*—Snell & Wilmer L.L.P.

(57) ABSTRACT

A micromechanical structure and device and methods of forming and using the structure and device are disclosed. The structure includes an ion conductor and a plurality of electrodes. Mechanical properties of the structure are altered by applying a bias across the electrodes. Such structures can be used to form device such as actuators and air-gap devices.

11 Claims, 5 Drawing Sheets

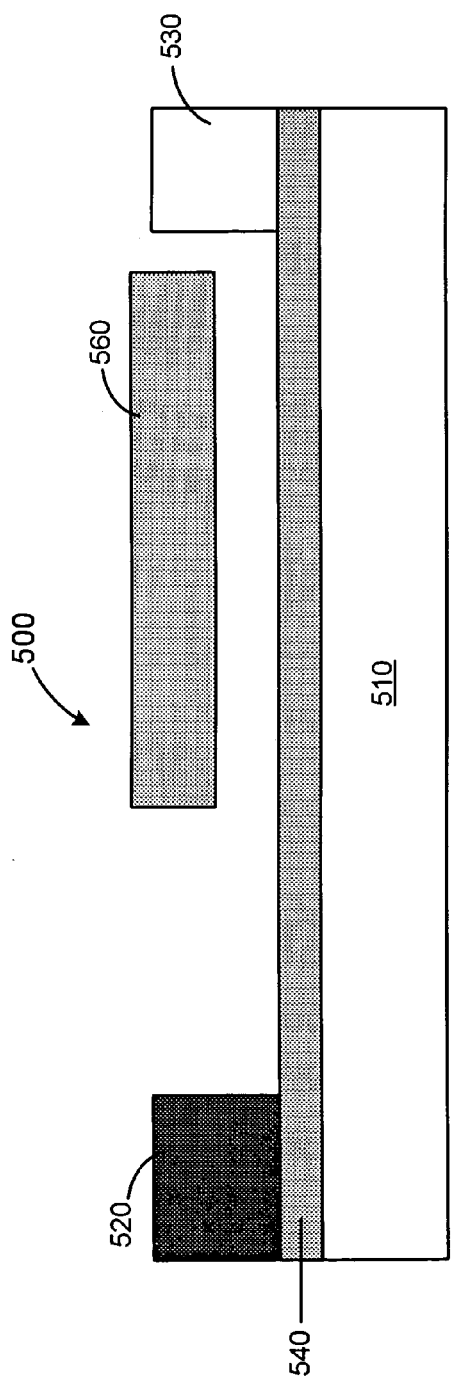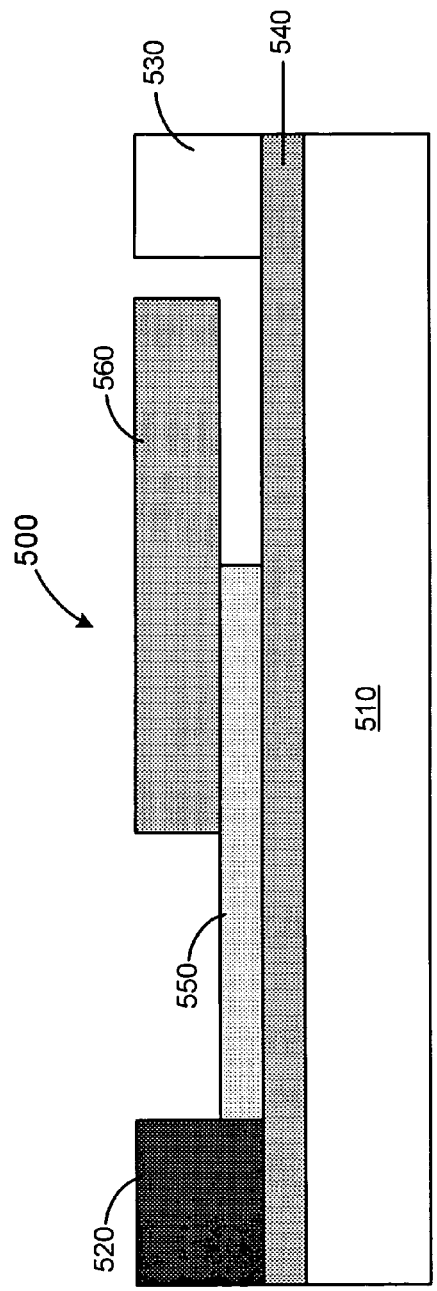

MICROMECHANICAL STRUCTURE, DEVICE INCLUDING THE STRUCTURE, AND METHODS OF FORMING AND USING SAME

CROSS REFERENCE TO RELATED APPLICATIONS

This application claims the benefit of U.S. patent application Ser. No. 60/500,136, entitled Programmable Metallization Cell Technology in Microactuators and Air Gap Switches, filed Sep. 3, 2003, claims priority to application Ser. No. 10/796,808, entitled Programmable Structure, An Array Including The Structure, And Methods Of Forming The Same, filed Mar. 17, 2003, and claims priority to application Ser. No. 10/282,902, entitled Tunable Cantilever Apparatus and Method of Making Same, filed Oct. 28, 2002.

FIELD OF INVENTION

The present invention generally relates to micromechanical structures and to devices including the structures. More particularly, the invention relates to micromechanical structures including an ion conductor material, devices including the structures, and to methods of forming and using the structures and devices.

BACKGROUND OF THE INVENTION

Micromechanical devices often include piezoelectric material, which undergoes a dimensional change upon application of a sufficient bias across the material. Although such piezoelectric material devices may work relatively well for some uses, such devices are problematic with regard to several applications. In particular, use of micromechanical structures that include piezoelectric material to effect a dimensional change typically requires application of a relatively large bias to cause a relatively small dimensional change in the material, and any dimensional change relaxes once the bias is removed. Thus, the devices require continuous application of a relatively large bias for so long as the material change is desired.

Additional problems arise because devices including typical piezoelectric materials are difficult to integrate with integrated circuits and microelectomechanical systems (MEMS). Consequently devices using piezoelectric materials are often reserved for discrete as opposed to integrated devices.

Other forms of piezoelectric material structures can be formed in such a way that a continuous bias is not required to sustain a dimensional change. However, these structures are relatively difficult to manufacture and are difficult to integrate with other devices.

Accordingly, improved micromechanical structures and devices including the structures that are relatively easy to fabricate, that are relatively easy to integrate with other devices, and that are relatively non-volatile are desired.

SUMMARY OF THE INVENTION

The present invention provides improved micromechanical structures and devices for use as, for example, microactuators and air-gap switches. More particularly, the invention provides structures that undergo a change resulting from migration of ions within the structure, to devices including the structures, and to methods of forming and using the structures and devices.

The ways in which the present invention addresses various drawbacks of now-known micromechanical devices are discussed in greater detail below. However, in general, the present invention provides a structure and a device that are relatively easy and inexpensive to manufacture, which are relatively easy to integrate with other devices, and which maintain their state when the source of electrical energy is removed, i.e., are relatively non-volatile.

In accordance with one exemplary embodiment of the present invention, a micromechanical structure includes an ion conductor and at least two electrodes. The structure is configured such that when a bias is applied across two electrodes, conductive material within the ion conductor migrates and thus alters a physical property of the ion conductor. In accordance with one aspect of this embodiment, the structure includes a conductive layer proximate the ion conductor and optionally includes an insulating layer between the ion conductor and the conductive layer. The conductive layer facilitates supplying electrons to the ion conductor when a bias is applied across the electrodes.

In accordance with another exemplary embodiment of the invention, a structure includes an ion conductor, at least two electrodes, and a barrier interposed between at least a portion of one of the electrodes and the ion conductor. In accordance with one aspect of this embodiment the barrier material includes a material configured to reduce diffusion of ions between the ion conductor and at least one electrode. The diffusion barrier may also serve to prevent undesired electrodeposit growth within a portion of the structure. In accordance with another aspect, the barrier material includes an insulating material. In accordance with yet another aspect of this embodiment, the barrier includes material that conducts ions, but which is relatively resistant to the conduction of electrons. Use of such material may reduce undesired plating at an electrode and increase the thermal stability of the device.

In accordance with another embodiment of the invention, a structure is formed on a surface of a substrate. In accordance with one aspect of this embodiment, the device includes an ion conductor layer and a first electrode and a second electrode overlying the ion conductor layer. In accordance with yet a further aspect of this embodiment, the structure is formed using deposition and etch processing.

In accordance with another embodiment of the invention, an actuator includes a structure including a first electrode, an ion conductor, and a second electrode. Physical properties of the actuator are altered by applying a sufficient bias across the first and second electrodes to cause conductive material to migrate through a portion of the ion conductor.

In accordance with another embodiment of the invention, an air-gap device includes a structure including a first electrode, an ion conductor, and a second electrode. Physical properties of the air-gap device are altered by applying a sufficient bias across the first and second electrodes to cause conducting material to migrate through a portion of the ion conductor.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

FIGS. 3, 4, 5(a) and 5(b) illustrate various devices formed using the structures of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Figure 1:
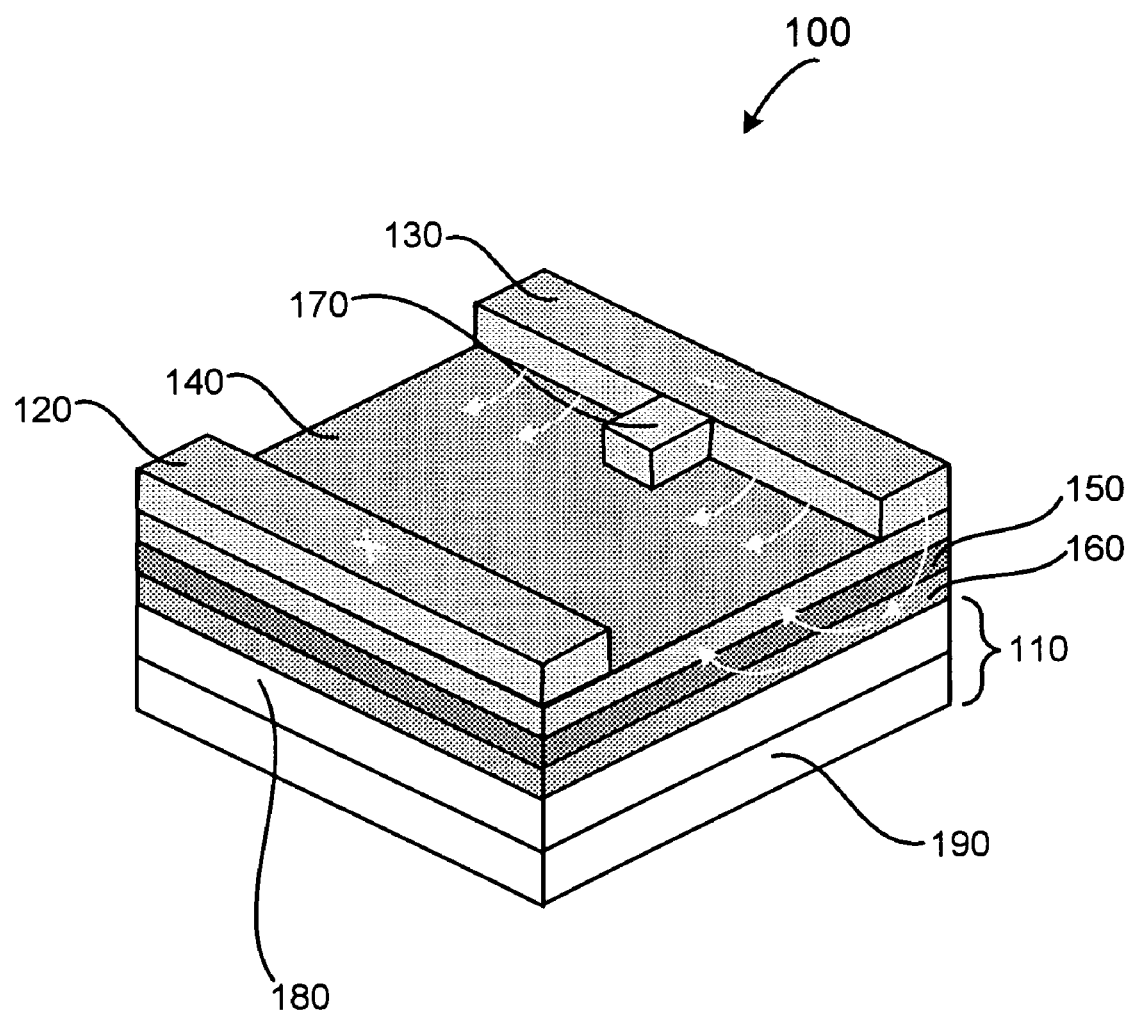
FIG. 1 illustrates a micromechanical structure formed on a surface of a substrate in accordance with the present invention.

FIG. 1 illustrates a micromechanical structure 100 formed on a surface of a substrate 110 in accordance with an exemplary embodiment of the present invention. Structure 100 includes electrodes 120 and 130, an ion conductor 140, and optionally includes buffer or barrier layer 150 and/or conducting layer 160. As will be discussed in greater detail below, structure 100 can be used to form devices such as actuators, air-gap switches, and the like. Moreover, because structure 100 can be formed overlying a substrate, the structure allows for monolithic integration of single components and arrays of the structures described herein with electronic, MEMS, or similar devices.

Generally, structure 100 is configured such that when a bias greater than a threshold voltage ($V_T$), discussed in more detail below, is applied across electrodes 120 and 130, conductive material within ion conductor 140 migrates and thus alters a physical property of structure 100. For example, as a voltage $V \geq V_T$ is applied across electrodes 120 and 130, conductive material within ion conductor 140 begins to migrate and form an electrodeposit (e.g., electrodeposit 170) at or near the more negative of electrodes 120 and 130. The term "electrodeposit" as used herein means any area within the ion conductor that has an increased concentration of reduced metal or other conductive material compared to the concentration of such material in the bulk ion conductor material. Electrodeposits 170 may have significant growth parallel to as well as normal to the electrolyte surface. As set forth in more detail below, electrodeposit 170 may be shaped to displace a cantilever or other movable components of devices such as air-gap devices and actuators.

In the absence of any insulating barriers, which are discussed in more detail below, the threshold voltage required to grow the electrodeposit is approximately the redox potential of the system, typically a few hundred millivolts. If the same voltage is applied in reverse, the electrodeposit will dissolve back into the ion conductor.

Referring again to FIG. 1, substrate 110 may include any suitable material. For example, substrate 110 may include semiconductive, conductive, semiinsulative, insulative material, or any combination of such materials. In accordance with one embodiment of the invention, substrate 110 includes an insulating material 180 and a portion 190 including microelectronic devices formed on a semiconductor substrate. Layers 180 and 190 may be separated by additional layers (not shown) such as, for example, layers typically used to form integrated circuits. Because the structures of the present invention can be formed over insulating or other materials, the structures are easily integrated with microelectronic or other devices and are particularly well suited for applications where substrate (e.g., semiconductor material) space is a premium.

In accordance with one exemplary embodiment of the invention, one of electrodes 120 and 130 is formed of a material including a metal that dissolves in ion conductor 140 when a sufficient bias ($V \geq V_T$) is applied across the electrodes (oxidizable electrode) and the other electrode is relatively inert and does not dissolve during operation of the device (an indifferent electrode). For example, electrode 120 may be an anode during a deposit 170 growth process and be comprised of a material including silver that dissolves in ion conductor 140 and electrode 130 may be a cathode during the deposit growth process and be comprised of an inert material such as tungsten, nickel, molybdenum, platinum, metal silicides, and the like. Having at least one electrode formed of a material including a metal which dissolves in ion conductor 140 facilitates maintaining a desired dissolved metal concentration within ion conductor 140, which in turn facilitates rapid and stable electrodeposit 170 formation within ion conductor 140. Furthermore, use of an inert material for the other electrode (cathode during an electrodeposit growth step) facilitates electrodissolution of any electrodeposit that may have formed. Various other configurations of ion conductor 140 suitable for use with the present invention are discussed in application Ser. No. 09/951,822, entitled Microelectronic Programmable Device And Methods Of Forming And Programming The Same, the contents of which are hereby incorporated herein by reference.

Ion conductor 140 is formed of material that conducts ions upon application of a sufficient voltage. Suitable materials for ion conductor 140 include glasses, plastics, and semiconductor materials. In one exemplary embodiment of the invention, ion conductor 140 is formed of chalcogenide material.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. An exemplary chalcogenide glass with dissolved metal in accordance with the present invention includes a solid solution of $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, where x ranges from about 0.1 to about 0.5, chalcogenide materials including silver, copper, zinc, combinations of these materials, and the like. In addition, conductor 140 may include network modifiers that affect mobility of ions through conductor 140. For example, materials such as metals (e.g., silver), halogens, halides, or hydrogen may be added to conductor 140 to enhance ion mobility and thus increase formation and dissolution of electrodeposits 170. In accordance with one exemplary embodiment of the invention, ion conductor 140 includes a germanium-selenide glass with silver diffused in the glass. Germanium selenide materials are typically formed from selenium and $Ge(Se)_{4/2}$ tetrahedra that may combine in a variety of ways. In a Se-rich region, Ge is 4-fold coordinated and Se is 2-fold coordinated, which means that a glass composition near $Ge_{0.20}Se_{0.80}$ will have a mean coordination number of about 2.4. Glass with this coordination number is considered by constraint counting theory to be optimally constrained and hence very stable with respect to devitrification. The network in such a glass is known to self-organize and become stress-free, making it easy for any additive, e.g., silver, to finely disperse and form a mixed-glass solid solution. Accordingly, in accordance with one embodiment of the invention, ion conductor 140 includes a glass having a composition of about $Ge_{0.17}Se_{0.83}$ to about $Ge_{0.25}Se_{0.75}$. Additional ion conductor materials and methods of forming the ion conductor are discussed in the '822 Application.

Contacts (not illustrated) may suitably be electrically coupled to one or more electrodes 120, 130 to facilitate forming electrical contact to the respective electrode. The contacts may be formed of any conductive material and are preferably formed of a metal such as aluminum, aluminum alloys, tungsten, or copper.

Insulating material layers 150 and 180 suitably include material that prevents undesired diffusion of electrons and/or ions from or to structure 100. In accordance with one embodiment of the invention, layers 150 and/or 180 include silicon nitride, silicon oxynitride, polymeric materials such as polyimide or parylene, or any combination thereof. Thus, when used, layer 150 helps prevent a short circuit between the anode and cathode via conducting layer 160.

Layer 160 includes material that can supply electrons to the electrolyte along its length between electrodes 120 and 130 to facilitate growth of electrodeposit 170. Exemplary materials suitable for layer 150 include semi-insulators such as thin (less than 2 nm) silicon dioxide or silicon nitride, or semi-insulating polycrystalline silicon. Exemplary materials suitable for layer 160 include conductors such as doped silicon or polycrystalline silicon, titanium nitride, or metals such as tungsten or aluminum.

By way of one specific example, silver in a GeSe ion conductor, will generate an ion current flow at an applied bias above approximately 300 mV. The electron current flow from the cathode reduces the excess metal due to the ion flux and hence a silver-rich electrodeposit 170 is formed on or in electrolyte 140. This amount of electrodeposited material (metal in excess of the starting composition of the electrolyte) is determined by the ion current magnitude and the time the current is allowed to flow.

A morphology of an electrodeposit generally depends on, among other things, the composition of the electrolyte. For example, for a given voltage, a starting glass $Ge_{0.3}Se_{0.7}$ into which the silver was photodissolved produces a relatively continuous electrodeposit, whereas a starting glass of $Ge_{0.4}Se_{0.6}$ showed a discontinuous growth. The $Ge_{0.4}Se_{0.6}$ material has also allowed significantly more perpendicular growth due to significant electrodeposition at the interface between the electrolyte and the electrodeposit, resulting in a 100 nm high deposit as compared to around 20 nm for the $Ge_{0.3}Se_{0.7}$ case.

When the ion current flows, the silver is believed to move as a coordinated motion of ions—essentially a "ripple effect" analogous to a shift register. In order to be reduced, the ionic silver must combine with the electron current from the cathode which means that the ions nearest the cathode will be reduced first and the conducting electrodeposit so formed will become the source of cathodic electrons during subsequent reduction. In this way, the growing electrodeposit "harvests" ions from the electrolyte as it grows out from the cathode, supplying electrons for the reduction of the local silver near its boundaries and thereby further extending the electrodeposit across the electrolyte. The electrodeposition process is reversible upon application of a reverse bias which makes the electrodeposit the oxidizable anode and re-plates the excess silver back onto the silver electrode.

Figure 2:
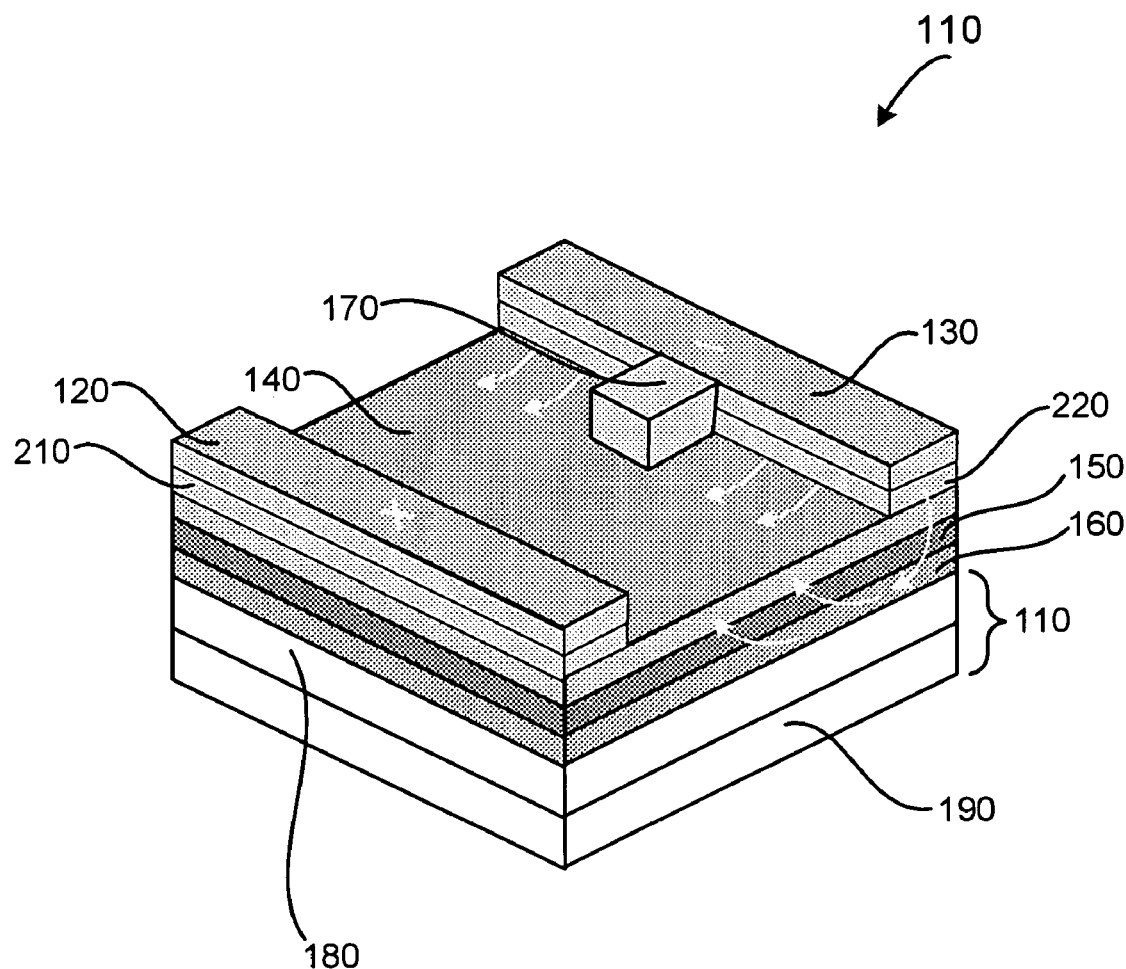
FIG. 2 illustrates a micromechanical structure in accordance with an alternative embodiment of the present invention.

FIG. 2 illustrates a structure 200 in accordance with another embodiment of the invention. Structure 200 is similar to structure 100, except structure 200 includes optional buffer layers 210 and 220.

Layers 210 and/or 220 may include a material that restricts migration of ions between conductor 140 and the electrodes. In accordance with exemplary embodiments of the invention, a barrier layer includes conducting material such as titanium nitride, titanium tungsten, a combination thereof, or the like. The barrier may be electrically indifferent, i.e., it allows conduction of electrons through structure 200, but it does not itself contribute ions to conduction through structure 200. An electrically indifferent barrier may reduce undesired dendrite growth, and thus may facilitate dissolution of electrodeposit 170 when a bias is applied which is opposite to that used to grow the electrodeposit. In addition, use of a conducting barrier allows for the "indifferent" electrode to be formed of oxidizable material because the barrier prevents diffusion of the electrode material to the ion conductor.

In accordance with one embodiment of the invention, structure 100 is formed by forming conductive layer 160 and insulating layer 150 overlying substrate 110, using, for example, deposition and etch techniques. Ion conductor material is then deposited overlying insulating layer and patterned. Next, any barrier layers are formed by depositing the barrier material and etching the material to form the barrier structure (e.g., structures 210 and 220). Electrodes 120 and 130 may be formed using, for example, deposition and etch techniques.

As noted above, an electrodeposit can be used in various micromechanical device applications, particularly those involving the elevation, tilting, translation, etc. of an object, structure, or other integrated component. Since the volume of the electrodeposit is dependent on the total Faradaic charge applied, a continuous range of non-volatile displacement is available from below one nm to in excess of 100 nm, controlled by an electrical signal. In addition, it is possible to use the perpendicular electrodeposit as a means for connecting two conductors separated by an air gap. This type of air-gap switch has great utility in, for example, rf switching applications. Note also that the switching surface is renewed by the electrodeposition effect which is also desirable for rf switching applications.

Figure 3:
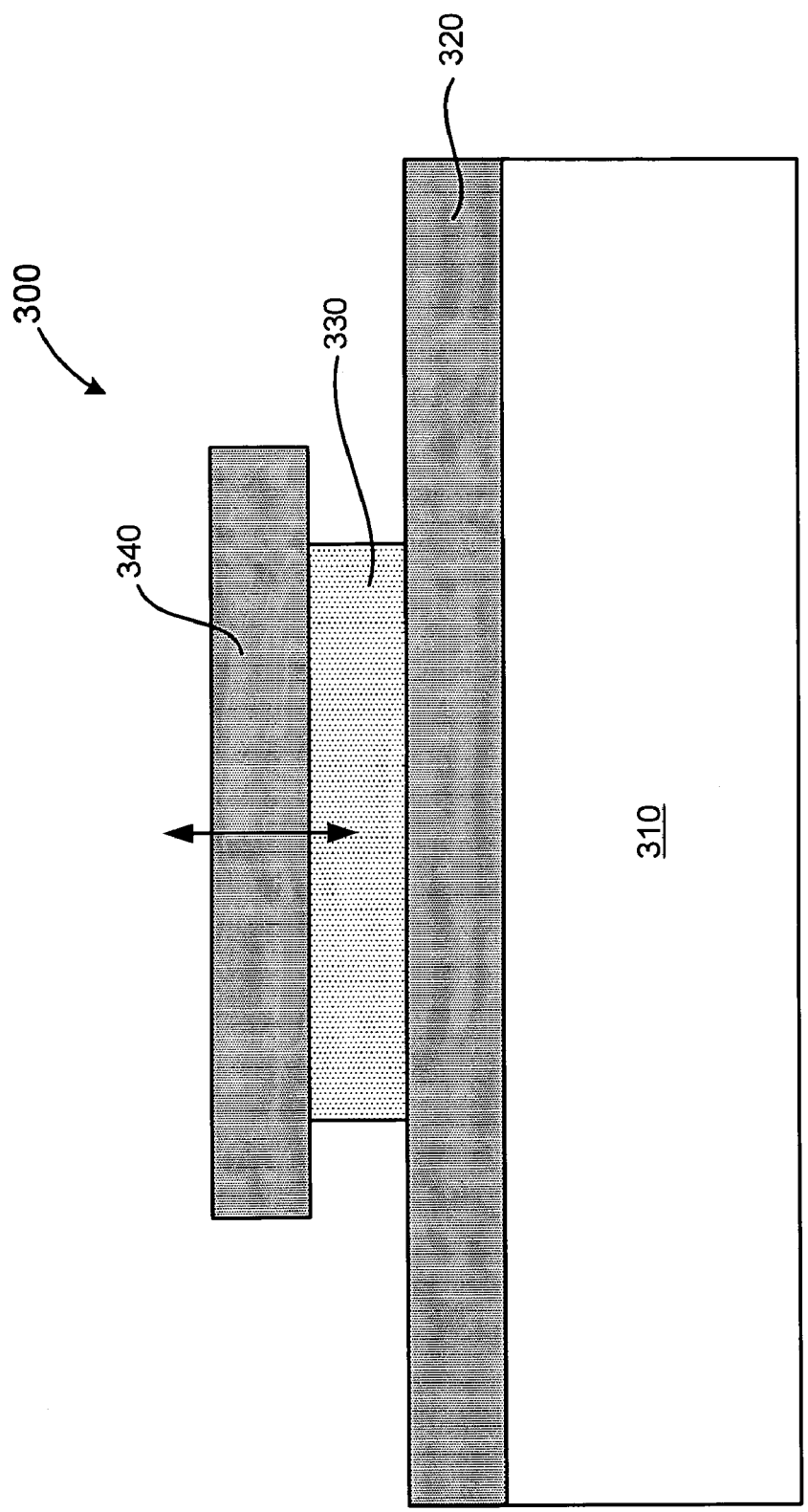
Figure 4:
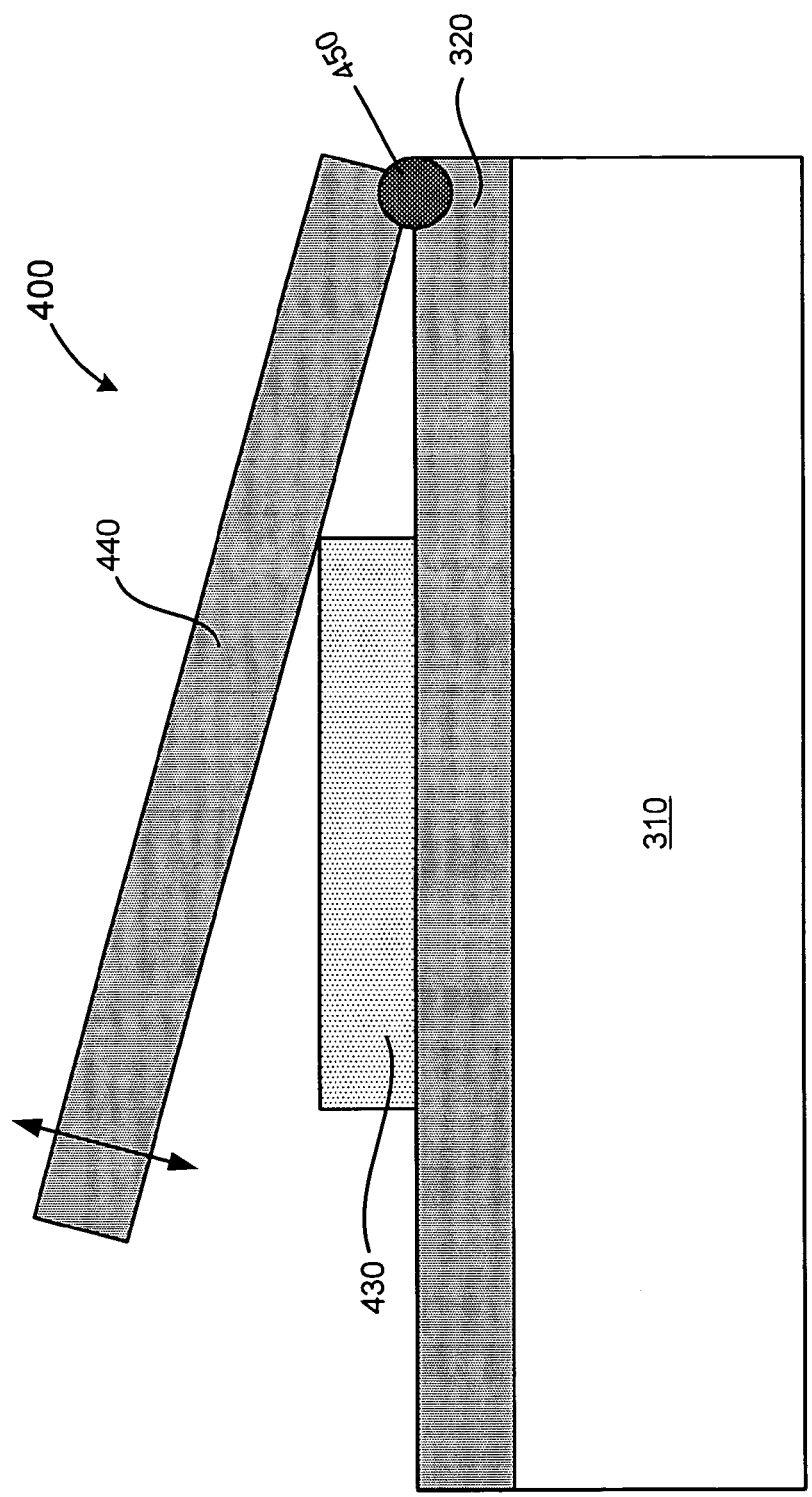

FIGS. 3 and 4 illustrate respectively a lift actuator 300 and a tilt actuator 400 in accordance with the present invention. Each actuator 300, 400 includes a substrate 310, which may be the same or similar to substrate 110; an ion conductor 320; an electrodeposit, respectively illustrated in FIGS. 3 and 4 as element 330, 430; a movable element 340, 440; and electrodes, such as electrodes 120, 130 described above, on the surface of conductor 330 and perpendicular to the plane of the illustration. For illustration purposes, the electrodes are not shown in FIGS. 3 and 4. Movable elements may be formed of any suitable material such as semiconductive, conductive, or insulating material, and may be formed by, for example, deposition and etch processing.

In operation, when a sufficient bias is applied across the electrodes, electrodeposits 330, 430 begin to grow, causing respective elements 340, 440 to move. In the case of lift actuator 300, moveable element is supported by a cantilever or a sliding mount. Similarly, in the case of tilt actuator 400, movable element 440 is anchored to substrate 310 via a hinge 450. Note that the movement of elements 340, 440 can be translated into horizontal movement using suitable linkages.

FIGS. 5(a) and 5(b) illustrate an air-gap switch 500 in accordance with the present invention. Switch 500 includes substrate 510, electrodes 520, 530, ion conductor 540, electrodeposit 550, and terminal 560. As illustrated in FIG. 5(a), during operation of switch 500, no current flows between electrode 520 and terminal 560 when no electrodeposit is present. As illustrated in FIG. 5(*b*), upon application of a sufficient bias across electrodes 520, 530 for a sufficient period of time, electrodeposit 550 grows and creates a short between electrode 520 and terminal 560.

Air-gap switches can also be formed using structures 300 and 400, such that an electrical circuit is opened or closed by, for example, lifting, tilting, or translation of a conducting component which is moved via growth or dissolution of an electrodeposit.

Although the present invention is set forth herein in the context of the appended drawing figures, it should be appreciated that the invention is not limited to the specific form shown. For example, while the micromechanical structures are conveniently described above in a horizontal configuration, the invention is not so limited; the structure of the present invention may suitably be formed as a vertical structure. Furthermore, although only some of the devices are illustrated as including buffer, barrier, or insulating layers, any of these layers may be added to the devices of the present invention. Various other modifications, variations, and enhancements in the design and arrangement of the method and apparatus set forth herein, may be made without departing from the spirit and scope of the present invention as set forth in the appended claims.

What is claimed is:

1. A micromechanical device comprising:
an ion conductor formed of an ion conductive material and conductive ions;
an oxidizable electrode proximate the ion conductor;
an indifferent electrode proximate the ion conductor;
an electrodeposit proximate the indifferent electrode; and
a movable element proximate the ion conductor, wherein said movable element moves when a bias sufficient to alter the electrodeposit is applied across the electrodes.

2. The micromechanical device of claim 1, further comprising a hinge coupled to the movable element.

3. The micromechanical device of claim 1, wherein the ion conductor comprises a solid solution selected from the group consisting of $As_xS_{1-x}$—Ag, $Ge_x$—Ag, $As_xS_{1-x}$—Cu, $Ge_xSe_{1-x}$—Cu, $Ge_xS_{1-x}$—Cu, where x ranges from about 0.1 to about 0.5.

4. The micromechanical device of claim 1, wherein the ion conductor comprises a glass having a composition of $Ge_{017}Se_{0.83}$ to $Ge_{0.25}Se_{0.75}$.

5. The micromechanical device of claim 1, wherein the indifferent electrode, the oxidizable electrode, and the ion conductor are formed on a surface of an insulating material layer overlying a substrate.

6. The micromechanical device of claim 1, further comprising a barrier layer between the indifferent electrode and the ion conductor.

7. The micromechanical device of claim 6, wherein the barrier layer comprises a conductive material.

8. The micromechanical device of claim 6, wherein the barrier layer comprises an insulating material.

9. An actuator comprising the device of claim 1.

10. The micromechanical device of claim 1, wherein the moveable element is supported by a cantilever.

11. The micromechanical device of claim 1, wherein the moveable element is supported by a sliding mount.

* * * * *